United States Patent
Sukekawa et al.

(10) Patent No.: US 11,488,963 B2
(45) Date of Patent: Nov. 1, 2022

(54) METHOD OF FORMING A SEMICONDUCTOR DEVICE

(71) Applicant: MICRON TECHNOLOGY, INC., Boise, ID (US)

(72) Inventors: Mitsunari Sukekawa, Higashihiroshima (JP); Yoshitaka Nakamura, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 256 days.

(21) Appl. No.: 16/996,527

(22) Filed: Aug. 18, 2020

(65) Prior Publication Data
US 2022/0059545 A1    Feb. 24, 2022

(51) Int. Cl.
*H01L 27/108*    (2006.01)
*H01L 21/311*    (2006.01)
*H01L 21/18*    (2006.01)

(52) U.S. Cl.
CPC ...... *H01L 27/10855* (2013.01); *H01L 21/187* (2013.01); *H01L 21/31116* (2013.01); *H01L 27/10814* (2013.01); *H01L 27/10823* (2013.01); *H01L 27/10876* (2013.01)

(58) Field of Classification Search
None
See application file for complete search history.

(56) References Cited

U.S. PATENT DOCUMENTS

2007/0170487 A1*  7/2007  Heitmann ......... H01L 27/10852
                                                    438/399

FOREIGN PATENT DOCUMENTS

JP          08186235 A    7/1996
JP       2003023071 A    1/2003

* cited by examiner

*Primary Examiner* — Steven M Christopher
(74) *Attorney, Agent, or Firm* — Dorsey & Whitney LLP (57) ABSTRACT

A method including forming a first member having a first portion including a plurality of storage capacitors therein and a second portion surrounding the first portion; forming a second member of a concave shape having a third portion, which corresponds to a lower top surface of the concave shape, including a plurality of access transistors provided correspondingly to the plurality of storage capacitors therein and a fourth portion, which corresponds to an upper top surface of the concave shape, surrounding the third portion; stacking the first member on the second member to physically connect the second and fourth portions and have a gap between the first and third portions; cutting the first member to physically separate the first portion from the second portion; and joining the separated first portion and the third portion with filling the gap therebetween.

20 Claims, 8 Drawing Sheets

METHOD OF FORMING A SEMICONDUCTOR DEVICE

BACKGROUND

Dynamic Random Access Memory (hereinafter referred to as DRAM) stores information in units of memory cells, with each memory cell being provided with an access transistor, and a storage capacitor connected to either the source or the drain of the access transistor. By providing DRAM with a plurality of memory cells, a high-capacity memory circuit is formed. Because the DRAM storage capacitors are formed in long and narrow pillar shapes, there is a possibility that the storage capacitors may collapse during the manufacturing process.

BRIEF DESCRIPTION OF THE DRAWINGS

FIG. 3 is a longitudinal section view illustrating one example of the schematic configuration in an exemplary process stage following FIG. 8.

DETAILED DESCRIPTION

Various embodiments of the present invention will be explained below in detail with reference to the accompanying drawings. The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

The embodiment will be described with reference to FIGS. 1 to 8. In the following description, DRAM is given as an example of a semiconductor device. However, the dimensions and dimensional ratios of the units in the diagrams do not necessarily match the dimensions and dimensional ratios in an actual semiconductor device. Furthermore, in the following description, the Y direction may be referred to as the vertical direction and the X direction may be referred to as the horizontal direction in some cases.

Figure 1:
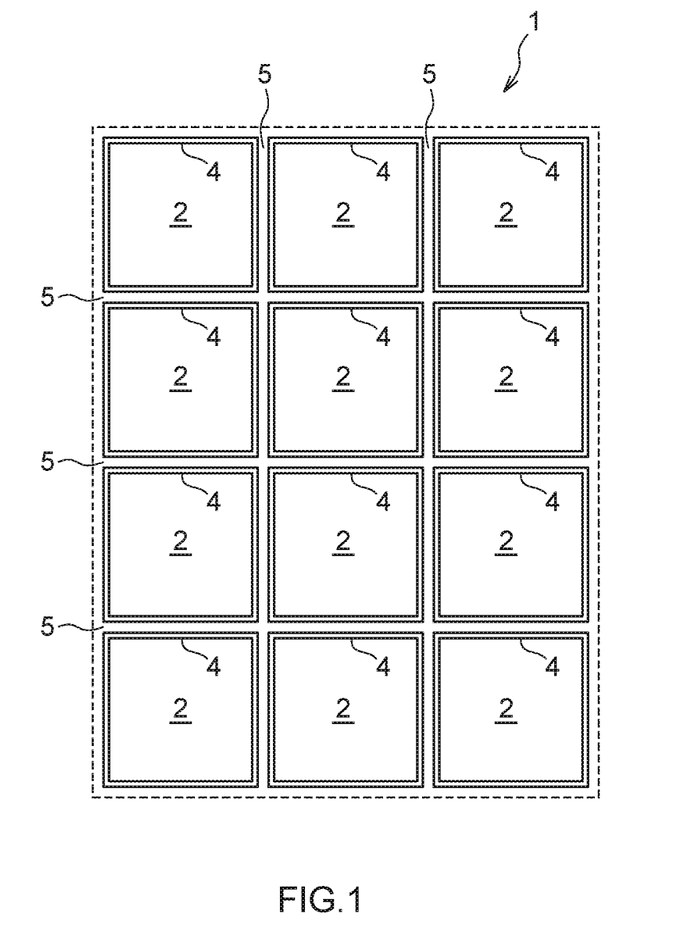
FIG. 1 is a plan view illustrating one example of a schematic configuration of the layout of a semiconductor device according to an embodiment.
Figure 2:
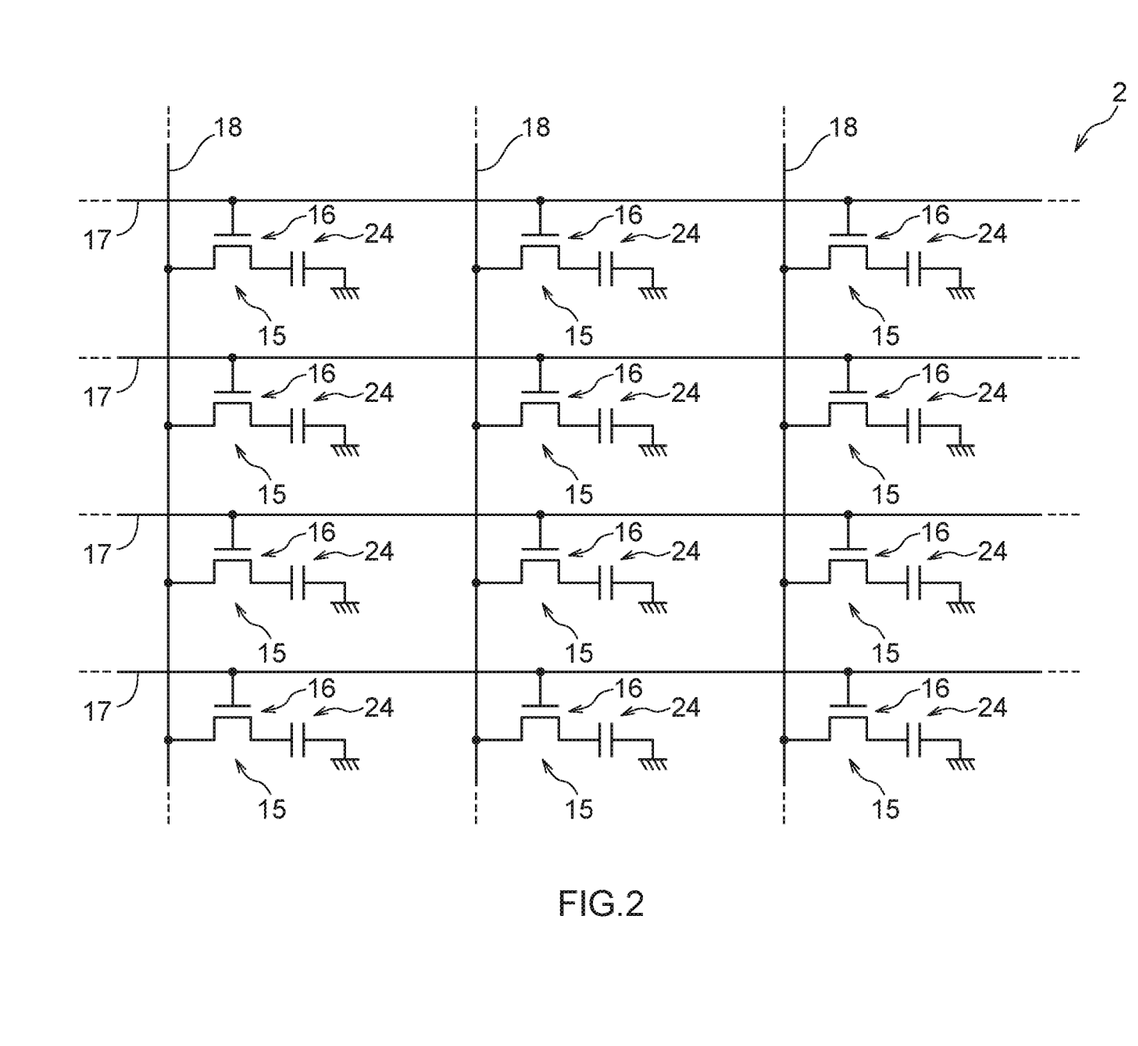
FIG. 2 is a circuit diagram illustrating a schematic configuration of an equivalent circuit of memory cells of the semiconductor device according to the embodiment.
Figure 3:
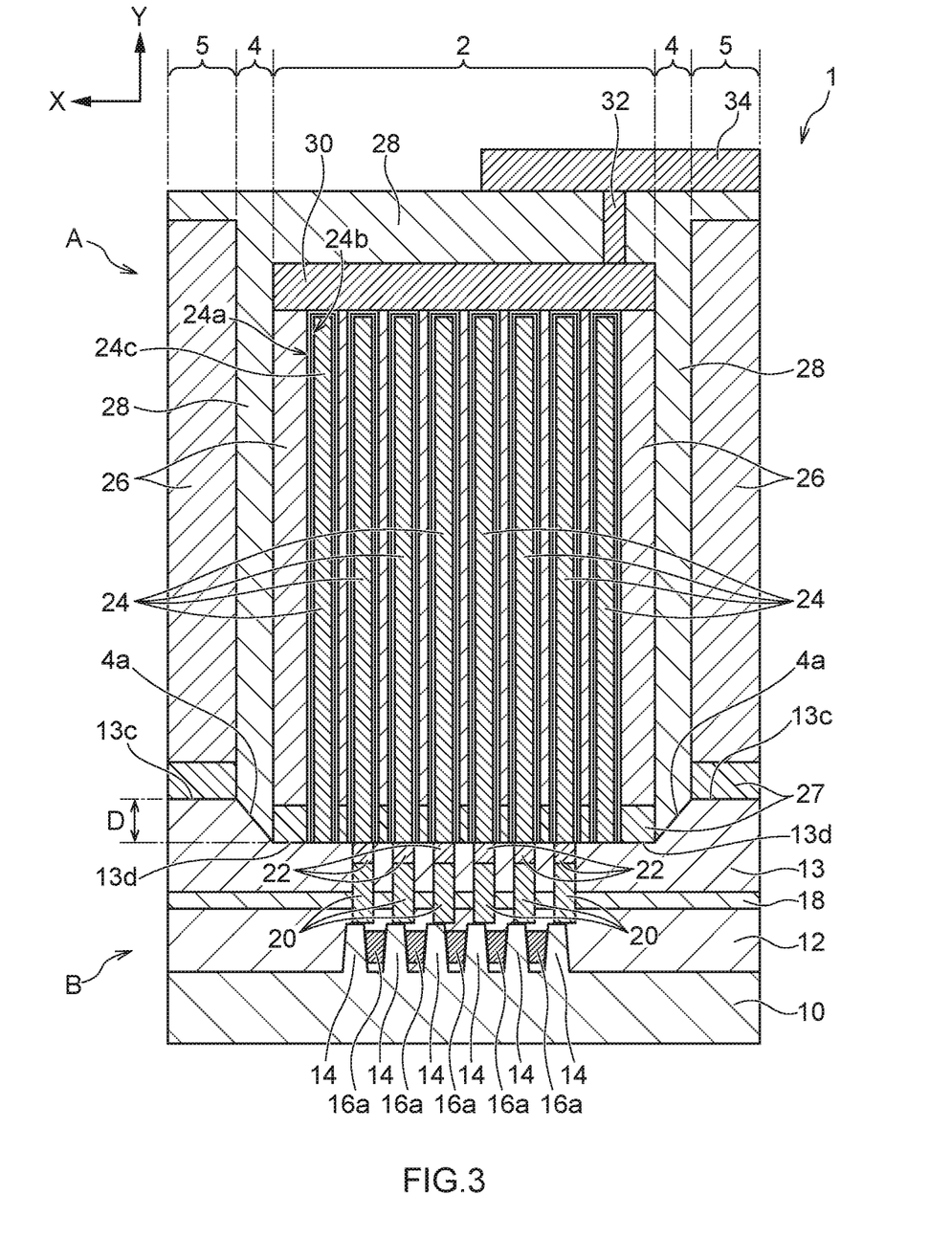
FIG. 3 is a diagram illustrating the semiconductor device and the method of manufacturing the same according to the embodiment, and is a longitudinal section view illustrating one example of the schematic configuration in a final process stage.

First, FIGS. 1 to 3 will be referenced to describe a semiconductor device 1 according to the embodiment. FIG. 1 is a plan view illustrating a schematic configuration of the semiconductor device 1. A plurality of memory mat portions 2 are arranged in a matrix. A memory mat edge portion 4 is provided surrounding each of the memory mat portions 2. A peripheral circuit portion 5 is provided surrounding the memory mat edge portions 4. A plurality of memory cells 15 are provided in the memory mat portions 2. The memory cells are DRAM memory elements. Note that the peripheral circuit portion 5 illustrated in the diagram is the edge of the peripheral circuit portion 5, and peripheral circuits disposed in the peripheral circuit portion 5 are not illustrated.

FIG. 2 illustrates an equivalent circuit of a memory cell array of the memory mat portions 2 forming DRAM. The plurality of memory cells 15 are arranged in a matrix, with each memory cell 15 being connected to the intersection point between a plurality of word lines 17 and a plurality of bit lines 18 disposed in straight lines. A single memory cell 15 includes a pair of an access transistor 16 and a storage capacitor 24. The access transistor 16 includes a metal-oxide-semiconductor field-effect transistor (MOSFET). Gate electrodes 16a (see FIG. 3) of the access transistors 16 function as the word lines 17 of DRAM. One of the source and the drain of each access transistor 16 is connected to one of the bit lines 18, while the other is connected to the storage capacitors 24. The storage capacitors 24 include capacitors, and store data by accumulating electric charge.

When writing data to a memory cell 15, a potential that turns on the access transistor 16 is applied to the word line 17, while a low potential or a high potential corresponding to "0" or "1" of the data to write is applied to the bit line 18. When reading out data from a memory cell 15, a potential that turns on the access transistor 16 is applied to the word line 17, and a data determination is made by having a sense amplifier connected to the bit line 18 sense the potential drawn out from the storage capacitors 24 to the bit line 18.

FIG. 3 is a longitudinal section view illustrating a schematic configuration of the semiconductor device 1 according to the embodiment. The memory mat edge portion 4 and the peripheral circuit portion 5 are disposed on either side of a memory mat portion 2. The semiconductor device 1 includes a first member A and a second member B. In FIG. 3, the first member A is disposed in the upper part, while the second member B is disposed in the lower part. The first member A and the second member B exist throughout the entire face of the plurality of the memory mat portions 2, the memory mat edge portions 4, and the peripheral circuit portion 5 of the semiconductor device 1 in FIG. 1. The first member A is provided with a first unit that includes the storage capacitors 24 positioned in the upper part of one of the memory mat portions 2 in FIG. 3. The second member B is provided with a second unit that includes the access transistor 16 positioned in the lower part of one of the memory mat portions 2 in FIG. 3. The first member A and the second member B are divided respectively into the first unit and the second unit including the memory mat portions 2, the memory mat edge portions 4, and the peripheral circuit portion 5.

The first member A includes a plurality of storage capacitors 24. In FIG. 3, the storage capacitors 24 have a pillar shape or a cup shape that is lone in the Y direction and narrow in the X direction. The storage capacitors 24 are formed by layering a first conductive part 24a, a High-K film 24b, and a second conductive part 24c on the inner walls of each long and narrow cup. The first conductive part 24a functions as an upper electrode, the High-K film 24b functions as a capacitive insulating film, and the second conductive part 24c functions as a lower electrode.

The first conductive part 24a and the second conductive part 24c contain a conductive material, and for example, the first conductive part 24a contains titanium nitride (TiN) while the second conductive part 24c contains titanium nitride (TiN) and ruthenium (Ru). The High-K film 24b contains an insulating material having a high relative permittivity, and for example, contains a metallic oxide material such as $HfO_2$, $ZrO_2$, $Al_2O_3$, or $ZrO_2$.

A plate electrode 30 electrically connected to the first conductive part 24a is provided above the storage capacitors 24. The plate electrode 30 is further connected to an upper electrode 34 through a contact plug 32. The plate electrode 30 and the contact plug 32 contains a conductive material such as tungsten (W), for example. The upper electrode 34 contains a conductive material such as aluminum (Al), for example.

The storage capacitor 24 is covered by a first insulating film 26 and a second insulating film 27. The first insulating film 26 and the second insulating film 27 contain an insulating material, and for example, the first insulating film 26 contains silicon dioxide ($SiO_2$), while the second insulating film 27 contains silicon nitride (SiN).

The peripheral circuit portion 5 contains the second insulating film 27 and a third insulating film 28. The memory mat edge portions 4, the peripheral circuit portion 5, and the storage capacitors 24 are covered by the third insulating film 28.

The second member B includes a semiconductor substrate 10 and a dielectric film 13. Also, in the second member B, an isolation 12, and active areas 14 demarcated by the isolation 12 and the gate electrodes 16a are formed in the semiconductor substrate 10. The active areas 14 comprise the source/drain region of the access transistor 16.

As the semiconductor substrate 10, a single-crystal semiconductor substrate such as a single-crystal silicon substrate is used, for example. The isolation 12 is obtained by forming grooves in the semiconductor substrate 10 and burying an insulating material in the grooves. For example, silicon dioxide ($SiO_2$) is buried in the isolation 12.

The isolation 12 functions as an isolation region that electrically isolates elements from each other. The dielectric film 13 contains an insulating material such as silicon dioxide ($SiO_2$), for example.

Figure 6:
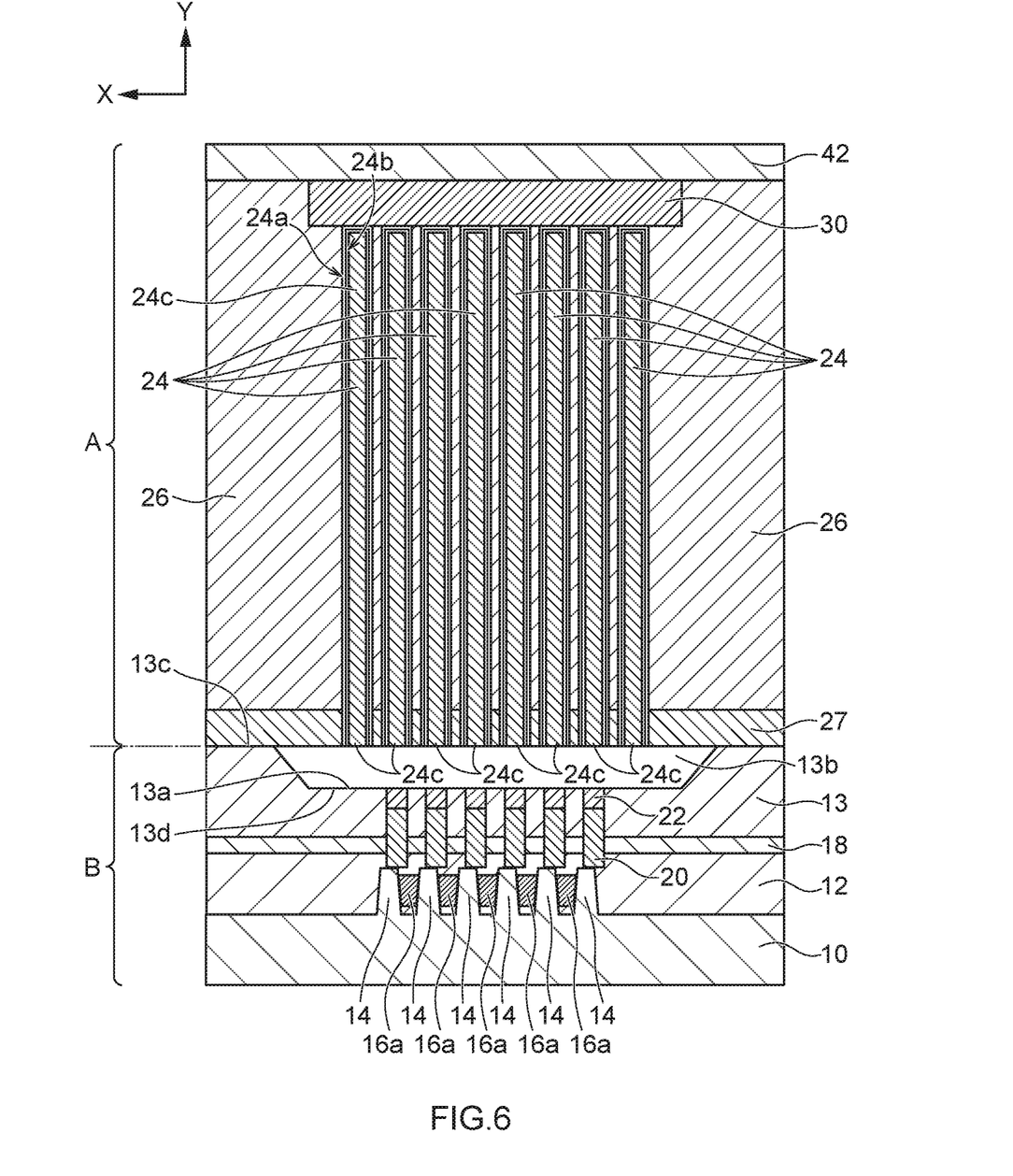
FIG. 6 is a diagram illustrating the method of manufacturing the semiconductor device according to the embodiment, and is a longitudinal section view illustrating one example of the schematic configuration in an exemplary process stage following FIG. 5.

The dielectric film 13 is depressed in the peripheral circuit portion 5 to form a concave 13a having a concave shape (see FIG. 6). A step D is formed between a lower top surface portion 13d of the concave 13a and an upper top surface portion 13c of the dielectric film 13 in the peripheral circuit portion 5. In each memory mat edge portion 4 positioned between one of the memory mat portions 2 and the peripheral circuit portion 5, a top face 13e of the dielectric film 13 has oblique faces 4a that, connect the upper top surface portion 13c and the lower top surface portion 13d. The upper top surface portion 13c is provided at the periphery of the concave 13a, and acts as a shoulder at a higher position than the lower top surface portion 13d of the concave 13a in each memory mat portion 2. The upper top surface portion 13c comprises the upper top surface of the concave 13a. The lower top surface portion 13d comprises the lower top surface of the concave 13a.

The gate electrodes 16a are formed in the active areas 14. In the embodiment, the gate electrodes 16a are formed as the gate electrodes of the trench-gate access transistors 16. The gate electrodes 16a contain a conductive material, and for example, contain at least one of titanium nitride (TiN), ruthenium (Ru), tungsten nitride (WN), tungsten (W), and poly-silicon (poly-Si).

Also, the second member B includes the bit lines 18, and each bit line 18 is connected to one side of the active areas 14 by a connecting portion not illustrated. The bit lines 18 contain a conductive material, and for example, contain at least one of tungsten silicide (WSi), tungsten nitride (WN), tungsten (W), titanium nitride (TiN), and ruthenium (Ru).

Contact plugs 20 and contact pads 22 are connected to the other side of the active areas 14, and the contact pads 22 are connected to the second conductive part 24c of the storage capacitors 24. As above, the semiconductor device 1 according to the embodiment includes one-transistor, one-capacitor type DRAM memory cells provided with the gate electrodes 16a, the active areas 14, the bit lines 18, and the storage capacitors 24.

Next, FIGS. 3 to 8 will be referenced to describe a method of manufacturing the semiconductor device 1 according to the embodiment.

Figure 4:
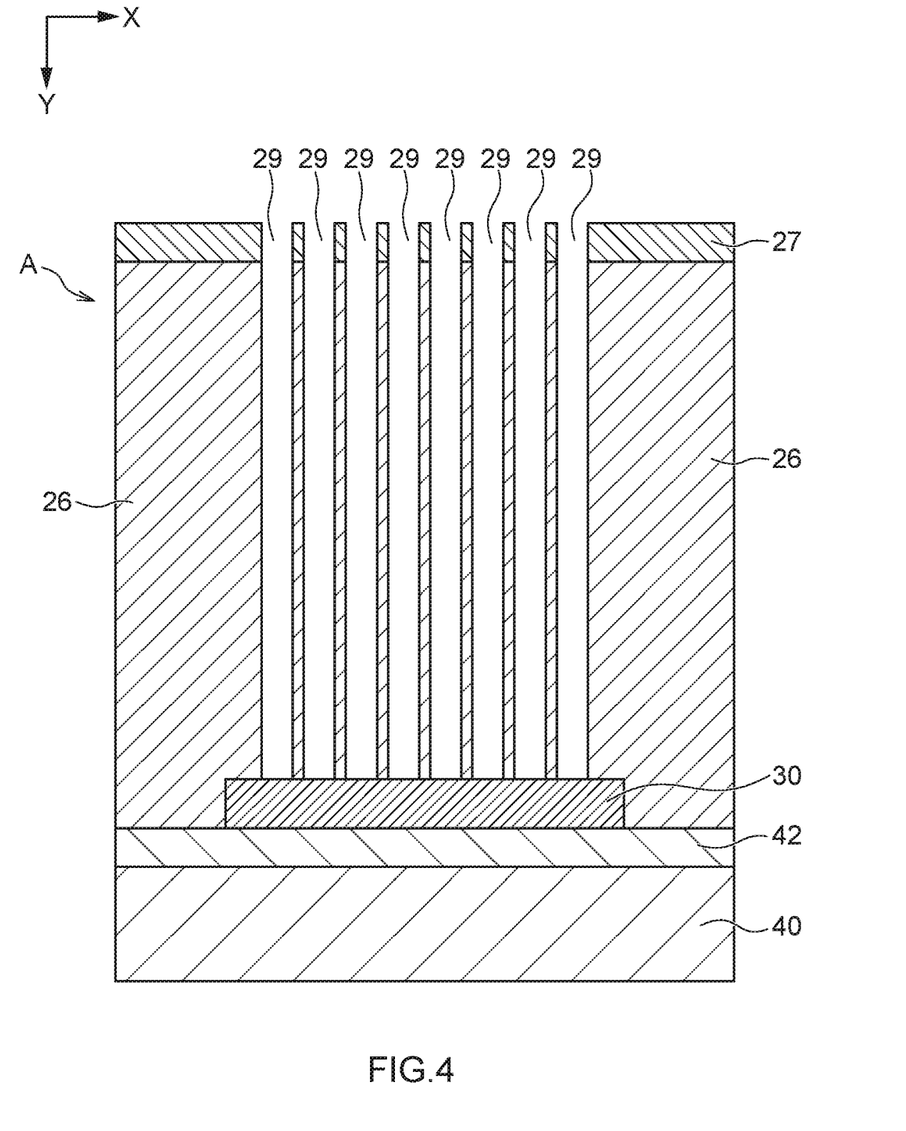
FIG. 4 is a diagram illustrating the method of manufacturing the semiconductor device according to the embodiment, and is a longitudinal section view illustrating one example of the schematic configuration in an exemplary process stage.
Figure 5:
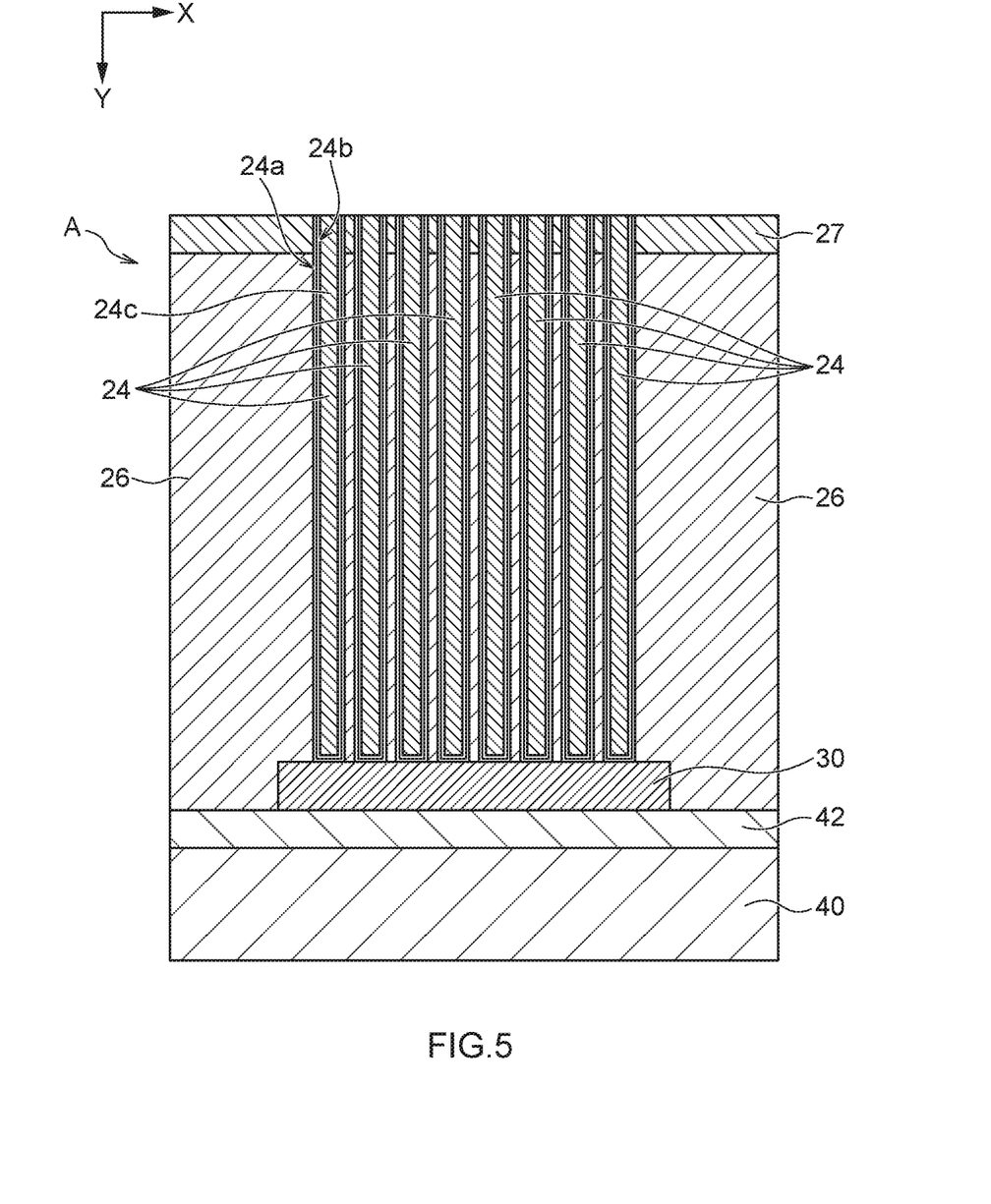
FIG. 5 is a diagram illustrating the method of manufacturing the semiconductor device according to the embodiment, and is a longitudinal section view illustrating one example of the schematic configuration in an exemplary process stage following FIG. 4.

First, FIGS. 4 and 5 will be referenced to describe a method of forming the first member A. As illustrated in FIG. 4, a cutting layer 42, the plate electrode 30, the first insulating film 26, and the second insulating film 27 are formed on a base substrate 40.

As the base substrate 40, a single-crystal semiconductor substrate such as a single-crystal silicon substrate is used, for example. The cutting layer 42 contains an insulating material such as silicon nitride (SiN), for example. The plate electrode 30 contains a conductive material such as aluminum, for example. The first insulating film 26 contains an insulating material such as silicon oxide, for example. The second insulating film 27 contains an insulating material such as silicon nitride (SiN), for example.

The cutting layer 42, the first insulating film 26, and the second insulating film 27 are formed by Chemical Vapor Deposition (hereinafter referred to as CVD), for example. The plate electrode 30 is, for example, obtained by depositing aluminum using CVD or sputtering, and then patterning the deposited aluminum by performing lithography and anisotropic dry etching.

Next, lithography and anisotropic dry etching are used to etch the second insulating film 27 and the first insulating film 26. With this arrangement, a plurality of grooves 29 penetrating from the top face of the second insulating film 27 to the top face of the plate electrode 30 are formed. Each of the grooves 29 has a pillar shape or a hole shape extending in a long and narrow shape in the Y direction of the diagram.

Next, as illustrated in FIG. 5, the first conductive part 24a, the High-K film 24b, and the second conductive part 24c are formed and buried inside the grooves 29. The first conductive part 24a, the High-K film 24b, and the second conductive part 24c are formed using CVD.

Thereafter, the first conductive part 24a, the High-k film 24b, and the second conductive part 24c are etched back to remove the excess first conductive part 24a, High-K film 24b, and second conductive part 24c formed on the top face of the second insulating film 27. With this arrangement, the first conductive part 24a, the High-K film 24b, and the second conductive part 24c are buried inside the grooves 29. The first conductive part 24a and the plate electrode 30 are in contact with each other and have electrical continuity.

The first conductive part 24a contains a conductive material such as titanium nitride (TiN), for example. The High-K film 24b contains an insulating material having a high relative permittivity, and for example, contains a metallic oxide including a metal such as zirconium (Zr) or aluminum (Al). The second conductive part 24c contains a conductive material such as titanium nitride (TiN) and ruthenium (Ru), for example. The upper edge face of the second conductive part 24c is exposed.

Next, as illustrated in FIG. 6, the first member A is inverted vertically and placed in an aligned state on top of the second member B prepared in advance, and the two members are bonded together.

The second member B is created as follows. The isolation 12, the active areas 14, and the gate electrodes 16a of the access transistor 16 are formed on the semiconductor substrate 10. The isolation 12 is formed by forming grooves in the semiconductor substrate 10 and burying an insulating material, for example, such as silicon dioxide ($SiO_2$), in the grooves. The gate electrodes 16a are formed by forming grooves in the active areas 14, and thereafter burying a conductive material in the grooves. Next, after forming the bit line 18, the dielectric film 13 is formed.

The bit line 18 is formed by CVD or sputtering, for example. The bit line 18 is patterned by performing lithoaraphy and anisotropic dry etching on a deposited conductive material.

The dielectric film 13 contains an insulating material such as silicon dioxide ($SiO_2$), for example. Inside the dielectric film 13, a plurality of contact plugs 20 that connect to the top face of each of the active areas 14 are provided. Furthermore, contact pads 22 that connect to the top face of each of the contact plugs 20 are provided. The contact plugs 20 and the contact pads 22 contain a conductive material such as tungsten (W), for example. A barrier metal, for example, such as titanium nitride (TiN) may also be provided between the contact plugs 20 and the active areas 14.

In the upper portion of the dielectric film 13, the concave 13a is formed in a region facing the memory mat portion 2. The concave 13a is formed using lithography and dry etching. Also, the oblique faces 4a that connect the upper top surface portion 13c and the lower top surface portion 13d can be formed by etching under etching conditions whereby a resist formed by lithography retreats in the horizontal direction.

The top faces of the contact pads 22 are formed to align with the lower top surface portion 13d of the concave 13a. The top faces of the contact pads 22 are exposed. On the dielectric film 13, the upper top surface portion 13c in the region corresponding to the peripheral circuit portion 5 exists at a higher position than the lower top surface portion 13d of the concave 13a.

In this way, the first member A and the second member B are prepared, and the two members are joined by a fusion bonding method. In the fusion bonding method, first, a treatment to attach a large number of hydroxyl groups to the surfaces of the first member A and the second member B, or in other words a hydrophilization treatment, is performed.

Next, the surfaces of the first member A and the second member B that have been subjected to the hydrophilization treatment are superimposed and joined together. The bonding according to the fusion bonding method is formed by hydrogen bonds between the hydroxyl groups on the hydrophilized surfaces. Joining according to the fusion bonding method can be performed at room temperature.

At this time, the first member A and the second member B are superimposed, stacked, and joined while also being positioned. The positioning is performed by, for example, forming alignment marks, not illustrated, on the first member A and the second member B in advance, and detecting the alignment marks.

A gap 13b is formed in the concave 13a between the lower surface of the first member A and the second member B, such that the storage capacitors 24 and the contact pads 22 do not touch. The edge faces of the contact pads 22 and the edge faces of the second conductive part 24c are exposed. Subsequently, the base substrate 40 of the first member A is removed by using anisotropic dry etching, for example.

Figure 7:
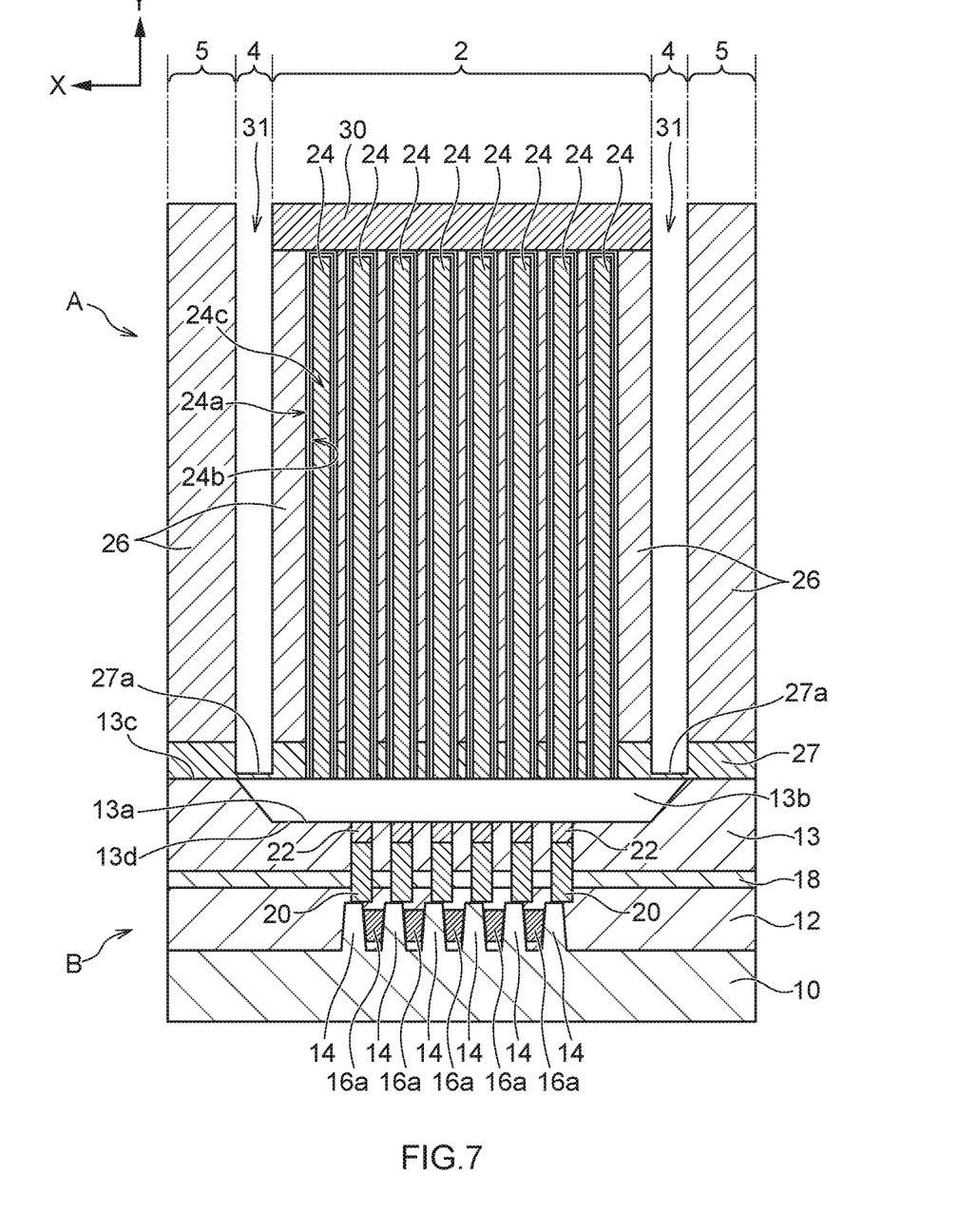
FIG. 7 is a diagram illustrating the method of manufacturing the semiconductor device according to the embodiment, and is a longitudinal section view illustrating one example of the schematic configuration in an exemplary process stage following FIG. 6.
Figure 8:
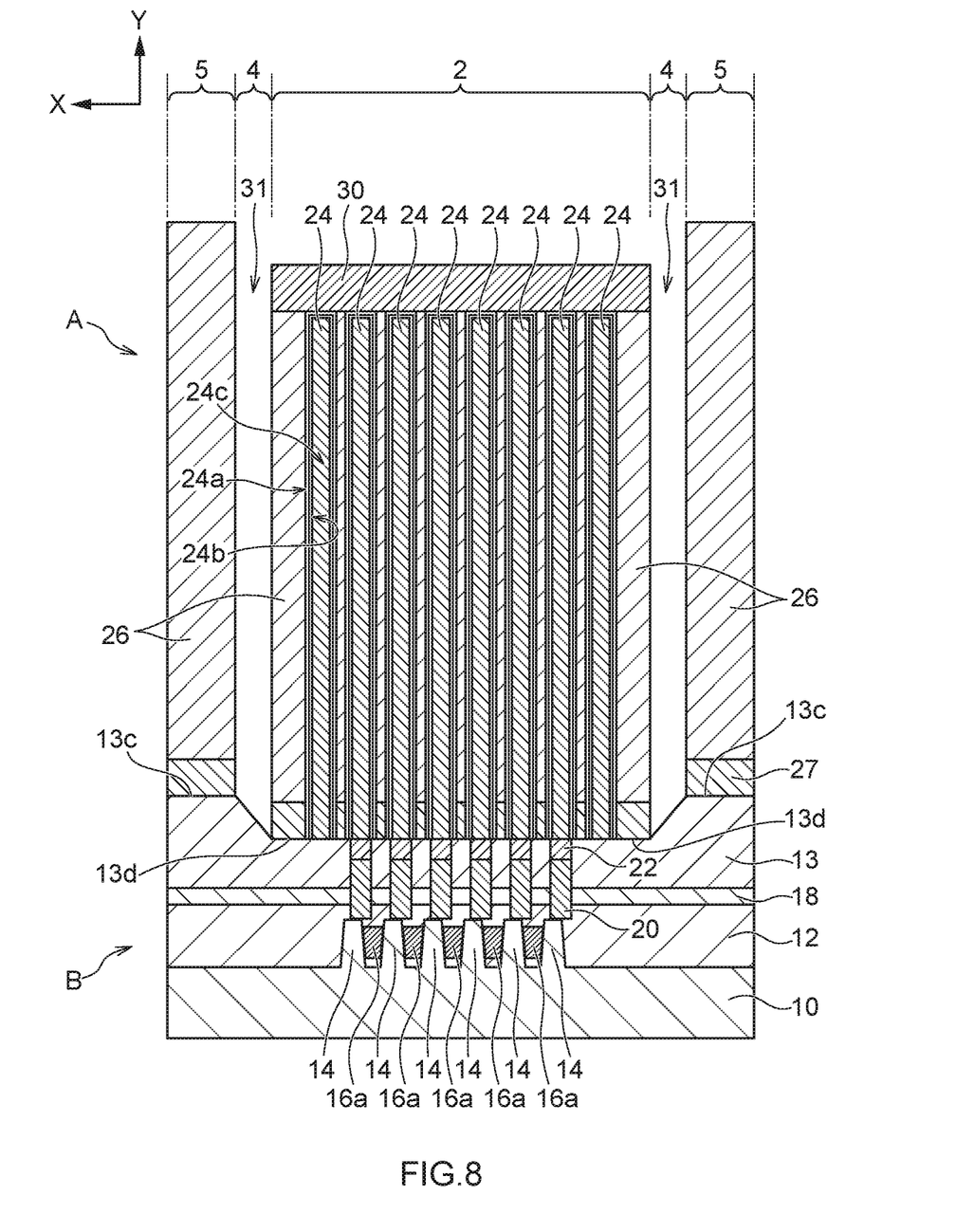
FIG. 8 is a diagram illustrating the method of manufacturing the semiconductor device according to the embodiment, and is a longitudinal section view illustrating one example of the schematic configuration in an exemplary process stage following FIG. 7.

Next, FIGS. 7 and 8 will be referenced to describe a step of separating the memory mat portion 2 from the first member A to connect the storage capacitors 24 and the contact pads 22. FIG. 7 illustrates a state immediately before FIG. 8. The change from the state illustrated in FIG. 7 to the state illustrated in FIG. 8 is achieved while etching grooves 31.

As illustrated in FIG. 7, the cutting layer 42 is removed by etching, and thereafter, grooves 31 are formed in the memory mat edge portions 4. The grooves 31 are formed using lithography and anisotropic dry etching, for example. etch the grooves 31, Reactive Ion Etching (RIE) is used. In the first half of the etching of the grooves 31, the etching is performed under conditions such that the etch rate of the silicon dioxide contained in the first insulating film 26 is large and the etch rate of the silicon nitride contained in the second insulating film 27 is small. As the etching device that performs the above etching, any of various etching devices can be used, for example, such as a microwave Electron Cyclotron Resonance (ECR) plasma device, a Capacitively Coupled Plasma (CCP) device, or an Inductively Coupled Plasma (ICP) device.

By etching according to the above conditions, the formation of the grooves 31 in the memory mat edge portions 4 proceeds, and the etching progress slows upon reaching the top face of the second insulating film 27. For this reason, the uniformity of the etching amount can be improved. After reaching the top face of the second insulating film 27, the etching conditions are changed to conditions suited to etching silicon nitride.

At this point, by lowering the etch rate of silicon nitride and improving the etching controllability, the uniformity of the etching amount is improved. During this time, the memory mat portion 2 and the peripheral circuit portion 5 of the first member A are connected by beams 27a formed by the remaining unetched portion of the second insulating film 27. Consequently, the memory mat portion 2 and the second member B still do not touch.

As etching proceeds further and the beams 27a are removed, the connection between the memory mat portion 2 and the peripheral circuit portion 5 of the first member A is released. At this point, a self-bias voltage is generated between the plasma produced by the RIE high-frequency discharge and the stage on which the wafer is placed, causing the plasma side to be charged positively while the stage side, that is, the wafer side, is charged negatively. Consequently, the first member A is charged more positively than the second member B, while the second member B is charged more negatively than the first member A.

In such a state, when the beams 27a joining the peripheral circuit portion 5 and the memory mat portion 2 of the first member A are removed, the peripheral circuit portion 5 and the memory mat portion 2 are separated from each other. In this way, an attracting force due to electrostatic force is generated between the first member A and the second member B, thereby attracting the members to each other. Moreover, the electrostatic force also acts between the conductive materials. In other words, an attracting force due to the electrostatic force is generated between the contact pads 22 and the storage capacitors 24. With this arrangement, as illustrated in FIG. 8, when the memory mat portion 2 and the second member B touch, the contact pads 22 and the storage capacitors 24 are attracted to each other and thereby are positioned in a self-aligned manner, resulting in a contacting state. At this time, the separated peripheral circuit portion 5 and memory mat portion 2 are connected with filling the gap 13b in between. After that, the contact pads 22 and the storage capacitors 24 are electrically connected by annealing. Through these steps, the configuration illustrated in FIG. 8 is formed. Also, during the etching, the wafer is clamped to the stage with an electrostatic chuck, and the electrostatic force of the chuck also generates an electrostatic force similar to the above.

Note that because the positioning of the memory mat portion 2 and the second member B is achieved by the electrostatic force exerted between the contact pads 22 and the storage capacitors 24, the contact pads 22 and the storage capacitors 24 may be misaligned by about one column in some cases. This is the reason why the number of storage capacitors 24 is greater than the number of contact pads 22, and guarantees that each contact pad 22 will have a corresponding storage capacitor 24 even if the contact pads 22 and the storage capacitors 24 are misaligned by one column.

Next, the third insulating film 28 is formed to cover the inside of the grooves 31 and the top face of the first member A. The third insulating film 28 can be formed by CVD, for example. Next, a contact hole that penetrates from the top face of the third insulating film 28 to the top face of the plate electrode 30 is formed in the third insulating film 28, and by burying a conductive material in the contact hole, the contact plug 32 is formed. Thereafter, the upper electrode 34 that connects to the contact plug 32 is formed on the third insulating film 28. The upper electrode 34 is deposited by CVD, and is patterned by lithography and anisotropic dry etching.

Through the above steps, the semiconductor device 1 according to the embodiment is formed as illustrated in FIG. 3.

According to the semiconductor device 1 and the method of manufacturing the same according to the embodiment, the following effects are exhibited.

The semiconductor device 1 having a one-transistor, one structure is achieved by forming the first member A and the second member B separately, and then joining the two members together. For this reason, the application of an unwanted heat treatment to the access transistor 16 mounted in the second member B can be avoided. For this reason, the performance of the access transistor 16 can be improved.

The positioning when connecting the second member B and the memory mat portion 2 of the first member A is achieved by utilizing the electrostatic force generated between the contact pads 22 and the storage capacitors 24. For this reason, step such as building in a special structure is not necessary, the manufacture of the semiconductor device 1 can be simplified, and the cost of the semiconductor device 1 can be lowered.

When the first member A and the second member B are brought together, a gap exists between the contact pads 22 and the storage capacitors 24 because of the concave 13a formed on the second member B, and the two members are not joined yet. Next, the memory mat portion 2 is separated from the first member A to make the memory mat portion 2 movable, and at this time, it is possible to position the two members correctly and in a self-aligned matter due to the electrostatic force generated between the contact pads 22 and the storage capacitors 24. Consequently, because the connection between the contact pads 22 and the storage capacitors 24 is secured, the yield of the semiconductor device 1 is improved, and cost savings for the semiconductor device 1 are achieved.

Because the number of storage capacitors 24 is greater than the number of contact pads 22, the one-transistor, one-capacitor combination can be achieved even if the contact pads 22 and the storage capacitors 24 are misaligned by one column when drawn together by the electrostatic force. With this arrangement, the yield of the semiconductor device 1 can be improved, making it possible to lower the cost of the semiconductor device 1.

In the formation of the storage capacitors 24, first, the cup-shaped grooves 29 are formed, and the first conductive part 24a, the High-K film 24b, and the second conductive part 24c are formed on the inner walls of the grooves 29. For this reason, because it is possible to avoid forming pillars of the storage capacitors 24, collapsing of the storage capacitors 24 can be avoided, making it possible to improve the yield of the semiconductor device 1.

As above, DRAM is given as an example to describe the semiconductor device according to various embodiments, but the above description is merely one example, and not intended to be limited to DRAM. Memory devices other than DRAM, for example, such as Static Random Access Memory (SRAM), flash memory, Erasable Programmable Read Only Memory (EPROM), Magnetoresistive Random Access Memory (MRAM), and phase-change memory can be applied as the semiconductor device. Furthermore, devices other than memory, for example, logic ICs such as a microprocessor and an Application Specific Integrated Circuit (ASIC) are also applicable as the semiconductor device according to the foregoing embodiments.

Although this invention has been disclosed in the context of certain preferred embodiments and examples, it will be understood by those skilled in the art that the inventions extend beyond the specifically disclosed embodiments to other alternative embodiments and/or uses of the inventions and obvious modifications and equivalents thereof. In addition, other modifications which are within the scope of this invention will be readily apparent to those of skill in the art based on this disclosure. It is also contemplated that various combination or sub-combination of the specific features and aspects of the embodiments may be made and still fall within the scope of the inventions. It should be understood that various features and aspects of the disclosed embodiments can be combined with or substituted for one another in order to form, varying mode of the disclosed invention. Thus, it is intended that the scope of at least some of the present invention herein disclosed should not be limited by the particular disclosed embodiments described above.

The invention claimed is:

1. A method comprising:
    forming a first member having a first portion including a plurality of storage capacitors therein and a second portion surrounding the first portion;
    forming a second member of a concave shape having a third portion, which corresponds to a lower top surface of the concave shape, including a plurality of access transistors provided correspondingly to the plurality of storage capacitors therein and fourth portion, which corresponds to an upper top surface of the concave shape, surrounding the third portion;
    stacking the first member on the second member to physically connect the second and fourth portions and have a gap between the first and third portions;
    cutting the first member to physically separate the first portion from the second portion; and
    joining the separated first portion and the third portion with filling the gap therebetween.

2. The method of claim 1, wherein stacking the first member on the second member to physically connect the second and fourth portions and have the gap between the first and third portions comprises using a fusion bonding method.

3. The method of claim 1, wherein each of the storage capacitors includes multilayer of a first conductive film, a High-K dielectric film, and a second conductive film.

4. The method of claim 3, wherein the third portion further comprises a plurality of active areas and a plurality of contact pads electrically connected to a plurality of the active areas, respectively.

5. The method of claim 4, wherein cutting the first member to physically separate the first portion from the second portion comprises performing Reactive Ion Etching.

6. The method of claim 5, wherein the first portion is attracted to the third portion by electrostatic force during Reactive Ion Etching, and the first portion and the third portion are joined after the first portion is separated from the second portion.

7. The method of claim 6, wherein electrostatic force is generated between the second conductive film of the plurality of storage capacitors of the first portion and the plurality of contact pads of the third portion, such that a positioning of the second conductive film and the plurality of contact pads is performed in a self-aligned manner.

8. The method of claim 1, wherein each of the plurality of access transistors includes a gate electrode, and the gate electrode includes at least one of TiN, Ru, WN, W and poly-silicon, and
    wherein the second portion further comprises a bit line, the bit line including at least one of WSi, WN, W, TiN, and Ru.

9. The method of claim 8, wherein the gate electrode functions as a DRAM word line.

10. The method of claim 2, wherein the fusion bonding method comprises executing hydrophilization treatment.

11. The method of claim 2, wherein the fusion bonding method. comprises performing a treatment to attach hydroxyl groups to a surface of the first portion and the second portion.

12. A method comprising:
    forming a first member having a plurality of first units each comprising a first portion including a plurality of storage capacitors therein and a second portion surrounding the first portion;
    forming a second member having a plurality of second units each comprising a third portion, which corresponds to a lower top surface of a concave shape, including a plurality of access transistors provided correspondingly to the plurality of storage capacitors therein and a fourth portion, which corresponds to an upper top surface of the concave shape, surrounding the third portion;
    stacking the first member on the second member to physically connect the second portion of each of the plurality of first units and the fourth portion of a corresponding one of the plurality of second units and have a gap between the first portion of each of the plurality of first units and the third portion of a corresponding one of the plurality of second units;
    cutting the first member to physically separate the first portion from the second portion in each of the plurality of first units; and
    joining the separated first portion of each of the plurality of first units and the third portion of a corresponding one of the plurality of second units with filling the gap therebetween.

13. The method of claim 12, wherein stacking the first member on the second member to physically connect the second and fourth portions and have the gap between the first and third portions comprises using a fusion bonding method.

14. The method of claim 12, wherein each of the plurality of storage capacitors includes multilayer of a first conductive film, High-K dielectric film, and a second conductive film.

15. The method of claim 14, wherein the third portion further comprises a plurality of active areas and a plurality of contact pads electrically connected to a plurality of the active areas, respectively.

16. The method of claim 15, wherein cutting the first member to physically separate the first portion from the second portion comprises performing Reactive Ion Etching.

17. The method of claim 16, wherein the first portion is attracted to the third portion by electrostatic force during Reactive Ion Etching, and the first portion and the third portion are joined after the first portion is separated from the second portion.

18. The method of claim 17, wherein electrostatic force is generated between the second conductive film of the plurality of storage capacitors of the first portion and the plurality of contact pads of the third portion, such that a positioning of the second conductive film and the plurality of contact pads is performed in a self-aligned manner.

19. The method of claim 13, wherein the fusion bonding method comprises executing a hydrophilization treatment.

20. The method of claim 13, wherein the fusion bonding method comprises performing a treatment to attach hydroxyl groups to a surface of the first portion and the second portion.

* * * * *